(12) United States Patent
Leitgeb

(10) Patent No.: US 11,037,881 B2
(45) Date of Patent: Jun. 15, 2021

(54) COMPONENT CARRIER WITH FACE-UP AND FACE-DOWN EMBEDDED COMPONENTS

(71) Applicant: AT&S Austria Technologie & Systemtechnik Aktiengesellschaft, Leoben (AT)

(72) Inventor: Markus Leitgeb, Trofaiach (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/590,614

(22) Filed: Oct. 2, 2019

(65) Prior Publication Data
US 2020/0111748 A1    Apr. 9, 2020

(30) Foreign Application Priority Data
Oct. 4, 2018    (EP) ..................................... 18198670

(51) Int. Cl.
*H01L 23/538*    (2006.01)
*H01L 21/48*    (2006.01)
(Continued)

(52) U.S. Cl.
CPC ...... *H01L 23/5389* (2013.01); *H01L 21/4857* (2013.01); *H01L 21/568* (2013.01);
(Continued)

(58) Field of Classification Search
CPC ..................... H01L 23/5389; H01L 25/0655; H01L 25/072
See application file for complete search history.

(56) References Cited

U.S. PATENT DOCUMENTS

2008/0041619 A1*  2/2008  Lee ........................ H01L 24/24
                                                                    174/260
2010/0140782 A1*  6/2010  Kim .................... H01L 23/5389
                                                                    257/690
(Continued)

FOREIGN PATENT DOCUMENTS

KR           20100041980 A       4/2010

OTHER PUBLICATIONS

Extended European Search Report in Application 18198670.4, dated Apr. 15, 2019, pp. 1-27, European Patent Office, Munich, Germany.

*Primary Examiner* — Farun Lu
(74) *Attorney, Agent, or Firm* — Robert A. Blaha; Smith Tempel Blaha LLC

(57) ABSTRACT

A component carrier includes a stack with at least one electrically conductive layer structure and/or at least one electrically insulating layer structure, a first component embedded in the stack, having at least one first pad on a bottom surface of the first component. The at least one first pad is electrically connected with a bottom surface of the stack. A second component embedded in the stack, having at least one second pad on a top surface of the second component. The at least one second pad is electrically connected with a top surface of the stack. The stack includes a first redistribution structure electrically connecting the at least one first pad of the first component with the bottom surface of the stack, and a second redistribution structure electrically connecting the at least one second pad of the second component with the top surface of the stack.

16 Claims, 3 Drawing Sheets

(51) Int. Cl.
*H01L 21/56* (2006.01)
*H01L 23/367* (2006.01)
*H01L 25/065* (2006.01)
*H01L 25/07* (2006.01)
*H01L 25/04* (2014.01)
*H01L 25/075* (2006.01)

(52) U.S. Cl.
CPC ........ *H01L 23/367* (2013.01); *H01L 23/5383* (2013.01); *H01L 23/5384* (2013.01); *H01L 25/042* (2013.01); *H01L 25/0655* (2013.01); *H01L 25/072* (2013.01); *H01L 25/0753* (2013.01); *H01L 2224/023* (2013.01)

(56) References Cited

U.S. PATENT DOCUMENTS

2014/0070396 A1 3/2014 Kyozuka et al.
2016/0324004 A1 11/2016 Schwarz et al.
2020/0279813 A1* 9/2020 Lift .......................... H01L 24/20

\* cited by examiner

US 11,037,881 B2

COMPONENT CARRIER WITH FACE-UP AND FACE-DOWN EMBEDDED COMPONENTS

TECHNICAL FIELD

Embodiments of the present invention relate to a method of manufacturing a component carrier and to a component carrier.

Technological Background

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. At the same time, component carriers shall be mechanically robust and electrically reliable so as to be operable even under harsh conditions.

In particular, embedding components in a component carrier in a com-pact way is an issue.

SUMMARY

There may be a need to embed and electrically contact components in component carriers in a compact way.

According to an exemplary embodiment of the invention, a component carrier is provided which comprises a stack comprising at least one electrically conductive layer structure (in particular a plurality of electrically conductive layer structures) and/or at least one electrically insulating layer structure (in particular a plurality of electrically insulating layer structures), a first component (in particular a plurality of first components) embedded in the stack, having at least one first pad (in particular a plurality of first pads) on a bottom surface of the first component, wherein the at least one first pad is electrically connected with a bottom surface of the stack, and a second component (in particular a plurality of second components) embedded in the stack, having at least one second pad (in particular a plurality of second pads) on a top surface of the second component, wherein the at least one second pad is electrically connected with a top surface of the stack, wherein the stack comprises a first redistribution structure electrically connecting the at least one first pad of the first component with the bottom surface of the stack, and wherein the stack comprises a second redistribution structure electrically connecting the at least one second pad of the second component with the top surface of the stack.

According to another exemplary embodiment of the invention, a method of manufacturing a component carrier is provided, wherein the method comprises providing a stack comprising at least one electrically conductive layer structure and/or at least one electrically insulating layer structure, embedding a first component in the stack, the first component having at least one first pad on a bottom surface of the first component, electrically connecting the at least one first pad with a bottom surface of the stack, embedding a second component in the stack, the second component having at least one second pad on a top surface of the second component, electrically connecting the at least one second pad with a top surface of the stack, forming the stack with a first redistribution structure electrically connecting the at least one first pad of the first component with the bottom surface of the stack, and forming the stack with a second redistribution structure electrically connecting the at least one second pad of the second component with the top surface of the stack.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "component" may particularly denote any inlay to be integrated in a component carrier stack, which inlay fulfills an electric function and which can be connected to electrically conductive layer structures of the stack via its one or more pads.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "redistribution structure" may particularly denote an array of interconnected electrically conductive elements which are configured to translate between relatively small dimensions of structures of a respective component (such as pad dimensions and/or distances of a semiconductor component) and larger dimensions of structures of component carrier technology (such as the dimension of exterior pads and traces of a printed circuit board (PCB)). A redistribution structure may also be denoted as a circuitry transferring a first spatial spacing (in particular a narrower spacing) of input/output contacts (in particular at a position of an embedded component such as a semiconductor chip) into a different second spatial spacing (in particular a wider spacing) of input/output contacts (in particular at an external position of a component carrier such as a printed circuit board). In other words, an electric fan-out function may be provided by a redistribution structure.

According to an exemplary embodiment of the invention, a component carrier is provided which has multiple embedded components each having one or more pads on one surface of the component. Advantageously, at least one of the components is embedded in a component carrier stack face-up (i.e. with the one or more pads oriented upwardly), while at least one other of the components is embedded in the component carrier stack face-down (i.e. with the one or more pads oriented downwardly). Moreover, each of the components has a respective layer structure transferring between the small component dimensions—in terms of electric structures—into larger component carrier dimensions at exterior main surfaces of the component carrier. Highly advantageously, the redistribution structure of the face-up component extends upwardly to the top surface of the component carrier, while the redistribution structure of the face-down component extends downwardly to the bottom surface of the component carrier. Thus, two relatively simple and relatively thin redistribution structures may be formed on two opposing sides of the embedded components ensuring a symmetric build up while keeping the entire component carrier compact in a vertical direction. In contrast to conventional approaches in which pads of multiple components have been arranged on the same side, exemplary embodiments of the invention avoid (or at least largely avoid) the need to form blind layers on the opposing side of the redistribution structures. Conventionally, such blind layers are implemented just for the purpose of increasing the degree of symmetry in the vertical direction which is advantageous to suppress undesired effects such as warpage. By relaxing or completely eliminating the need of the formation of blind layers by exemplary embodiments of the invention, a combination of a compact design of the component carrier with a proper suppression of undesired warpage may be obtained. Thus, any trouble with unbalanced thickness of dielectric layers of a component carrier with embedded components can be avoided according to an exemplary embodiment. Consequently, component carriers according to exemplary embodiments do not suffer from warpage issues and are nevertheless thin in a vertical direction.

In the following, further exemplary embodiments of the method and the component carrier will be explained.

In an embodiment, at least one of the first component and the second component is an active component, in particular a semiconductor chip. Components capable of controlling current by means of another electrical signal may be denoted as active components (for instance semiconductor chips). Components incapable of controlling current by means of another electrical signal may be called passive devices. Resistors or capacitors are examples for passive components. For active components with frequently quite high number of pads, the advantageous thickness reduction in view of the efficient configuration of the redistribution structures as a result of the mixed face-up and face-down architecture is particularly pronounced.

In an embodiment, no pads are formed on a top surface of the first component. In other words, the top surface of the first component may be free of pads. Correspondingly, no pads may be formed on a bottom surface of the second component. In other words, the bottom surface of the second component may be free of pads as well. Thus, the components may be configured with a single-sided pad configuration.

In an embodiment, at least one of the first redistribution structure and the second redistribution structure comprises a plurality of electrically conductive structures extending over multiple layer structures of the stack. For instance, the respective redistribution structure may comprise a plurality of vertically stacked and interconnected copper filled laser vias. The more layers the redistribution structures cover, the stronger is the obtainable thickness reduction, because this may allow saving a larger number of blind layers. Thus, embodiments with complex redistribution structures are particularly advantageous.

In an embodiment, the first redistribution structure is configured for spatially spreading lateral element sizes and/or lateral element-to-element distances of elements of the electrically conductive layer structures from smaller lateral dimensions at the at least one first pad to larger lateral dimensions at the bottom surface of the stack. Correspondingly, the second redistribution structure may be configured for spatially spreading lateral element sizes and/or lateral element-to-element distances of elements of the electrically conductive layer structures from smaller lateral dimensions at the at least one second pad to larger lateral dimensions at the top surface of the stack. In particular, the mentioned elements may be individual sections of a pattered metal layer (for instance copper traces or pads), vertical through connections (such as copper filled laser vias), etc. Thus, the redistribution structures may convert small and closely neighboured electrically conductive elements at the component pads' level (for instance in compliance with semiconductor technology) into larger and wider spaced elements at the respective connection surface of the component carrier (for example in compliance with PCB technology).

Such an electric spreading may be accompanied by a heat spreading to thereby efficiently remove heat generated by the components during operation of the component carrier. This may be accomplished by configuring the dimension and the material of the electrically conductive layer structures also of a highly thermally conductive material (such as copper or aluminium) with sufficient amount of material so as to be capable of removing a considerable amount of heat.

In an embodiment, the first component and the second component are arranged side by side within the stack, in particular at the same vertical levels. Such a lateral adjacent arrangement of the components also contributes to the vertical compactness of the component carrier.

In an embodiment, the first component and the second component have different vertical thicknesses. The high flexibility of the manufacturing architecture according to exemplary embodiments of the invention is compatible with components having different heights. Components of different heights in the same component carrier and having their pads facing towards different main surfaces of the component carrier may even advantageously promote identical vertical extensions of laser through holes contacting the pads.

As a general further embodiment, but in particular also specifically referring to the previously described embodiment, a vertical distance between the at least one first pad and the bottom surface may be identical to a vertical distance between the at least one second pad and the top surface. Such a configuration is highly advantageous in terms of contacting the embedded components of different thickness, since the adjustment of a laser for forming laser drill holes which are subsequently filled with electrically conductive material can then be done in the same way for both sides of the component carrier (in particular without a re-adjustment of laser parameters). A cumbersome re-adjustment of the laser drilling procedure on front side and back side may then be dispensable. Preferably, pad-core distances may be the same in the component carrier when the components are selected to have appropriate different heights.

In another embodiment, the first component and the second component have the same vertical thicknesses. Further preferable, upper main surfaces of the first component and the second component may be aligned and lower main surfaces of the first component and the second component may be aligned as well.

In an embodiment, the stack is formed with a symmetrical build-up above the first component and the second component compared to below the first component and the second component. Also, when taking this measure, disturbing phenomena such as warpage of the component carrier and the tendency of delamination of constituents of the component carrier may be avoided.

In an embodiment, regions of the stack directly above the first component and directly below the second component are formed exclusively by one of the at least one electrically insulating layer structure. This may ensure a reliable electric isolation and mechanical protection of the embedded components on their respective pad-free surface. Apart from these regions, the component carrier may be advantageously free of blind layers. This also contributes to the small volume consumption and light weight of the component carrier.

In an embodiment, a vertical center of the stack is formed by a base structure, in particular a core, having a bottom surface aligned with bottom surfaces of the first component and the second component. The core may be a central portion of the stack having cavities for accommodating the components. For instance, such a core may be made of fully cured material (such as FR4).

In an embodiment, the base structure has a top main surface aligned with a top main surface of only (or exactly) one of the first component and the second component. In such an embodiment, an upper surface of one of the components may be in flush with the base structure, while the upper surface of another one of the components may vertically extend beyond the base structure or may be vertically retracted with regard to the top surface of the base structure. By appropriately adjusting the number and/or the thickness of layer structures above and below of the components, it may still be possible to keep the dielectric layer thickness to be traversed by a drilling laser beam identical on the top side and the bottom side of the component carrier.

In another embodiment, the base structure has a top main surface which is not aligned with any of top main surfaces of the first component and the second component. In particular when both of these components have a height smaller than the height of the base structure, lamination of at least partially uncured dielectric sheets may nevertheless allow properly embedding the components without or at least substantially without voids and without risk of damage of the components. However, it may also be possible that one or both of the components vertically protrude(s) beyond the base structure, as long as it is ensured that the respective component is not damaged during lamination. An acceptable amount of the respective component protruding beyond the base structure may be selected in accordance with a dielectric material used for lamination (for instance prepreg or ABF). For instance, at least one at least partially uncured electrically insulating layer structure (for instance a prepreg layer) may be laminated on both the base structure and the components. During this lamination process, i.e. the application of heat and/or pressure, dielectric material of the previously at least partially uncured electrically insulating layer structure may melt or may become liquid and may also flow in the gap between component and base structure or stack. During this lamination, the previously at least partially uncured electrically insulating layer structure may be cured by cross-linking of a resin material thereof. After that, the cross-linked and cured material is re-solidified and fixes the components in place in the cavities of the core or stack.

In yet another embodiment, it is also possible that top surfaces of both the first component and the second component are aligned with a top surface of the base structure.

In an embodiment, the at least one first pad of the first component and the at least one second pad of the second component are electrically connected via the at least one electrically conductive layer structure. By electrically connecting the first component and the second component, they may functionally cooperate to fulfil together one overall electronic target functionality.

In an embodiment, the method comprises providing a base structure with a first cavity and a second cavity, placing the first component in the first cavity so that the at least one first pad of the first component is oriented in a downward direction, and placing the second component in the second cavity so that the at least one second pad of the second component is oriented in an upward direction. Such a manufacturing architecture may render it possible in a simple way to combine a face-up component with a (preferably functionally cooperating) face-down component in the same component carrier.

In an alternative embodiment, the method comprises providing a base structure with a common cavity, placing the first component in the common cavity so that the at least one first pad of the first component is oriented in a downward direction, and placing the second component in the common cavity so that the at least one second pad of the second component is oriented in an upward direction. Thus, multiple components may be accommodated in the same cavity, wherein pads of different ones of the components may be oriented towards opposite main surfaces.

In an embodiment, the method comprises attaching a temporary carrier to a bottom surface of the base structure so that the at least one first pad of the first component is attached to the temporary carrier and the at least one second pad of the second component is facing away from the temporary carrier. Correspondingly, a pad-free surface of the first component may face away from the temporary carrier, while a pad-free surface of the second component may be attached to the temporary carrier. The temporary carrier may provide temporarily mechanical support for the components before the arrangement of base structure and components becomes rigid by a below described lamination procedure.

In particular, the method may further comprise laminating at least one of the at least one electrically insulating layer structure to an upper main surface of the base structure facing away from the temporary carrier. After the laminating, the temporary carrier may then be removed, since the arrangement of base structure, components and laminated dielectric material may now be sufficiently rigid that the support function of the temporary carrier is no longer needed. In addition or alternatively to the described lamination, it is also possible to at least partially fill the at least one cavity within a filling medium (in particular adhesive material) before or after placing the respective component in the respective cavity. For instance, the filling medium may be filled in the cavity by dispensing, an ink-jet procedure, etc.

For instance, such a temporary carrier may be a sticky tape which may be attached to the back side of the base structure and which may close a through-hole in the base structure for delimiting a respective cavity for a respective one of the components. The respective component may then be placed on the sticky surface of the temporary carrier so as to ensure a correct positioning of the component. After having attached and connected (in particular by lamination) the electrically insulating layer structure to the base structure and the component while simultaneously filling the gaps in between with material of the electrically insulating layer structure to thereby obtain a rigid structure, the temporary carrier is no longer needed and can be removed from the back side. Thus, it is possible that the temporary carrier does not form part of the readily manufactured component carrier. Nevertheless, the temporary carrier may contribute to the spatially accurate positioning of the components in the base structure. Such an accurate positioning is in particular highly advantageous when one of the components is embedded face-up (i.e. with the respective pad(s) only on its top side) and another of the components is embedded face-down (i.e. with the respective pad(s) only on its bottom side).

In an embodiment, a height of at least one of the first component and the second component is adjusted to correspond to a height of the base structure. Such height adjustment may be carried out for instance by grinding a respective component until it has reached a target thickness (for instance identical to the thickness of the base structure). Such a height adjustment may also contribute to the compact configuration of the component carrier.

In an embodiment, the method comprises electrically connecting at least one of the at least one first pad with the bottom surface of the stack and the at least one second pad with the top surface of the stack by laser drilling through at least one of the at least one electrically insulating layer structure and by subsequently at least partially filling at least one laser drilled hole. As an alternative to laser drilling, mechanical drilling is a further option. As a further alternative to laser drilling, it is also possible to accomplish z-axis connection using a photo-imageable dielectric (PID). Filling the drilled hole (in particular with copper) may be done by electroless plating, in particular followed by galvanic deposition.

In an embodiment, the method comprises designing the component carrier in the following way: Firstly, an electronic target functionality is defined which is to be fulfilled by a component to be embedded in the component carrier. In other words, a definition may be made which electronic target functionality (for instance a microprocessor functionality) shall be fulfilled by the component carrier with component. Subsequently, the target functionality is split into a first partial functionality and a second partial functionality (for instance a part of the functionality of the microprocessor is assigned to the first partial functionality, and another part of the functionality of the microprocessor is assigned to the second partial functionality). Thereafter, the first component may be designed to fulfil the first partial functionality. Correspondingly, the second component may be designed to fulfil the second partial functionality. After this virtual analysis of the component carrier and the components to be embedded therein to meet the above described functional constraints, both the first component and the second component can be physically provided (in particular selected or manufactured) in accordance with the previously derived design. Then, the first component with the at least one first pad on the bottom surface and the second component with the at least one second pad on the top surface can be embedded physically in the stack. By taking this measure, it can be ensured on the one hand that the component carrier with embedded components meets the previously defined electronic target functionality. By first virtually and subsequently physically splitting one component into two for fulfilling this target functionality, it becomes possible to spatially separate the partial functionalities and consequently the components to arrange one of the components face-up and the other one face-down. Advantageously, this simultaneously increases compactness of the component carrier, since the number of required blind layers can be reduced in this way. A compact, but nevertheless fully functional design can thereby be obtained in a highly advantageous way.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure and/or thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

A substrate or interposer may comprise or consist of at least a layer of glass, silicon, ceramic and/or organic material (like resin). A substrate or interposer may also comprise a photo-imageable or dry-etchable organic material like epoxy-based Build-Up films or polymer compounds like Polyimide, Polybenzoxazole, or Benzocyclobutene.

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, glass-spheres, multi-layer glass, glass-like materials), prepreg material, photo-imageable dielectric material, polyimide, polyamide, liquid crystal polymer (LCP), epoxy-based Build-Up Film, polytetrafluoroethylene (Teflon®), a ceramic, and a metal oxide. Reinforcing materials such as webs, fibers or spheres, for example made of glass (multilayer glass) may be used as well. Although prepreg (such as FR4), or epoxy-based Build-Up Film or photo-imageable dielectrics are usually preferred, other materials may be used as well. For high frequency applications, high-frequency materials such as polytetrafluoroethylene, liquid crystal polymer and/or cyanate ester resins may be implemented in the component carrier as electrically insulating layer structure. Teflon® is a registered trademark of the Chemours Company FC, LLC of Wilmington, Del., U.S.A.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one of the first and second components (and optionally at least one further embedded and/or surface mounted component) can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier (for example a printed circuit board, a substrate, or an interposer) in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
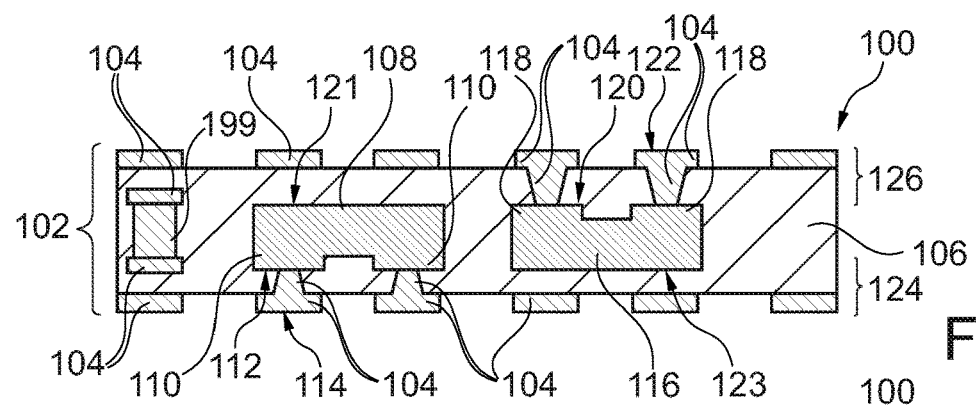
FIG. 1 illustrates a cross-sectional view of a component carrier according to an exemplary embodiment of the invention.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, a thin and flat component carrier type fan-out package may be obtained by placing components, being embedded in the component carrier, partially face-up and partially face-down.

Fan-out Packages conventionally arrange components facing all in the same direction. This is conventionally done to enable formation of a redistribution structure for interconnection and fan-out of the components after encapsulation. Therefore, all fan-out layers of these components have to be oriented in one direction of the components which is demanding a certain number of layers. In order to keep a balanced structure in a chip first approach to avoid warpage, blind layers have to be added on the other side of the package in such conventional approaches of embedding in laminate. This may however increase the thickness as well as the manufacturing costs of the component carrier and may reduce the yield of a package in the mentioned conventional approaches. Coreless stack-ups might overcome the mentioned issues with the increased thickness at least partially, but have limitations in die thickness and show similar disadvantage in terms of warpage.

In order to overcome the mentioned and/or other shortcomings at least partially, an exemplary embodiment of the invention assembles (preferably active) components face-up and face-down in a package-type component carrier manufactured by embedding in laminate. In an embodiment, it is also possible to split one large die into at least two smaller dies (as an example for the mentioned components) and embed one of the smaller components face-up and another one face-down in the component carrier. This may decrease the number of needed fan-out layers/layers of a respective redistribution structure for the respective components on a component pad side (in particular a chip termination side) of the package or component carrier, as there may be less input/output connections (I/O) on each side. This may, in turn, reduce thickness and increase yield of a component carrier according to an exemplary embodiment.

In order to achieve a constant thickness of a dielectric layer for the components (in particular chip) interconnection of a component carrier according to an exemplary embodiment, the thickness of the component (in particular semiconductor die), which is placed face-up can be advantageously tuned to match a core thickness. Such a core—or more generally base structure—may be a central electrically insulating layer structure in the component carrier having cavities in which the components may be embedded. The mentioned embodiment with matched dielectric thicknesses of both sides of the component carrier may allow a reliable via formation process with a constant dielectric thickness on both sides of the package for component (in particular chip) interconnection. This can be achieved for example by using a proper grinding process, or by taking any other appropriate measure.

Hence, a component carrier according to an exemplary embodiment of the invention may involve a face-up and face-down assembly in a package to reduce number and/or thickness of fan-out layers of a corresponding redistribution structure.

In particular, an embodiment may advantageously match the components to a core thickness for double sided interconnection. Advantageously, a total number of needed build-up layers can be reduced. Furthermore, a balanced dielectric thickness may be obtained with the component carrier according to an exemplary embodiment to efficiently suppress warpage of the component carrier. A reliable interconnection of the components (in particular a chip interconnection) may be achieved due to a known or properly adjustable dielectric thickness.

In particular, exemplary embodiments of the invention may contribute to reduce a number of build-up layers and the thickness of a component carrier according to an exemplary embodiment. This may be advantageous in particular in terms of a chip-first approach in which a chip type component is embedded relatively early in the manufacturing process. Additionally, a proper chip interconnection can be approved by matching the components to a core of the stack.

Thus, exemplary embodiments may use a face-up/face-down concept to reduce the number of fan-out layers or of a redistribution structure to reduce or even minimize functionally inactive blind layers (which may be implemented only to obtain a symmetric build-up), in particular but not exclusively for chip first solutions.

Furthermore, it may be possible according to exemplary embodiments of the invention to use at least partially uncured material (such as a prepreg sheet) to enclose the component(s). It is furthermore possible to match components (in particular semiconductor dies) to a core to enable the same dielectric thickness on top and bottom side.

FIG. 1 illustrates a cross-sectional view of a laminate-type plate-shaped component carrier 100 according to an exemplary embodiment of the invention. In the illustrated embodiment, the component carrier 100 is embodied as printed circuit board (PCB).

The configuration according to FIG. 1 implements a face-up assembly of a component 116 and a face-down assembly of another component 108 in one package, i.e. in one and the same component carrier 100, to reduce a number and a thickness of needed fan-out layers. These fan-out layers are the various layers used for forming redistribution structures 124, 126 of the components 108, 116.

The component carrier 100 according to FIG. 1 comprises a laminated layer stack 102 composed of multiple electrically conductive layer structures 104 and multiple electrically insulating layer structures 106. The electrically conductive layer structures 104 may comprise patterned metal layers (such as patterned copper foils) and metallic vertical interconnects. The vertical interconnects may be formed, for example, by mechanically drilling or laser drilling. Correspondingly formed drill holes may then be at least partially filled with electrically conductive material (for instance copper), for instance by a combination of electroless plating and subsequent galvanic plating. In the illustrated embodiment, the vertical interconnects are formed by forming holes by laser drilling and subsequently filling the holes by copper plating.

Figure 3:
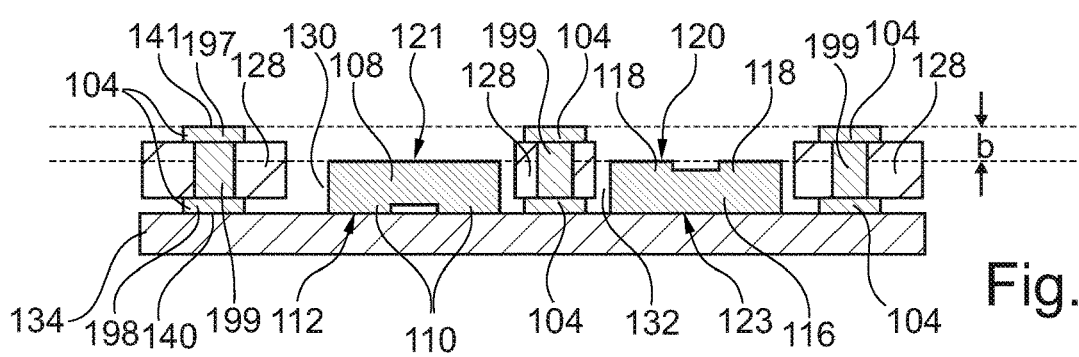
FIG. 3 and FIG. 4 illustrate cross-sectional views of structures obtained during carrying out a method of manufacturing a component carrier with embedded components, shown in FIG. 4, according to an exemplary embodiment of the invention.

A vertically central region of the stack 102 may be formed by a base structure 128 as shown in FIG. 3. Such a base structure 128 may for example be a core. One or more vertical interconnects (in particular laser through holes or plated through holes) may be formed to extend vertically through the base structure 128 and therefore through at least part of the vertical thickness of the stack 102 in any of the embodiments described herein (compare reference numeral 199 in FIG. 3).

A first component 108 is embedded in the stack 102. The first component 108 may be an active electronic component such as a semiconductor die (for instance a processor chip). The first component 108 has (in the shown embodiment two, wherein any other number is possible) first pads 110 on a bottom surface 112 of the first component 108. In contrast to this, no pads are formed on a top surface 121 of the first component 108. The first pads 110 are electrically connected, by some of the electrically conductive layer structures 104, with a bottom surface 114 of the stack 102. A first redistribution structure (which may also be denoted as redistribution layer, RDL) structure 124, which is formed by electrically conductive layer structures 104 on the bottom side of the first component 108, electrically connects the first pads 110 of the first component 108 with the bottom surface 114 of the stack 102. The first redistribution structure 124 may spatially spread the various shown electrically conductive elements of the electrically conductive layer structures 104 from smaller chip pad sizes at the contacted surface of the first component 108 to larger PCB pad sizes on an exterior main surface of the component carrier 100. The electric connection of the first pads 110 with the bottom surface 114 of the stack 102 is accomplished by laser drilling through the bottom side electrically insulating layer structure 106 and by subsequently at least partially filling the at least one laser drilled hole with electrically conductive material such as copper.

Additionally, a second component 116 is embedded in the same stack 102. Also, the second component 116 may be an active electronic component such as a semiconductor die (for instance a memory chip, which may functionally cooperate with and which may be electrically connected with the above-mentioned processor chip). It should however be said that the implementation of the first component 108 as microprocessor chip and the second component 116 as memory chip is just an example. It is also possible that the first component 108 of the second component 116 provide other functions and do not functionally cooperate, or that they functionally cooperate in accordance with another functionality than the combination of a microprocessor-memory-task. The second component 116 has (in the shown embodiment two, wherein any other number is possible) second pads 118 on a top surface 120 of the second component 116. In contrast to this, no pads are formed on a bottom surface 123 of the second component 116. The second pads 118 are electrically connected, by other ones of the electrically conductive layer structures 104, with a top surface 122 of the stack 102. A second redistribution structure 126 (which may also be denoted as redistribution layer, RDL), which is formed by electrically conductive layer structures 104 on the top side of the second component 116, electrically connects the second pads 118 of the second component 116 with the top surface 122 of the stack 102. The second redistribution structure 126 may spatially spread the electrically conductive elements of the electrically conductive layer structures 104 from smaller chip pad sizes at the contacted surface of the second component 116 to larger PCB pad sizes on an exterior main surface of the component carrier 100. The electric connection of the second pads 118 with the top surface 122 of the stack 102 is accomplished by laser drilling through the respective electrically insulating layer structure 106 and by subsequently partially filling the at least one laser drilled hole with electrically conductive material such as copper.

In view of the embedding of the first component 108 face-down (i.e. with the first pads 110 located at the bottom) in combination with the embedding of the second component 116 face-up (i.e. with the second pads 118 located at the top), the redistribution structures 124, 126 may be formed with a relatively small entire thickness and without the need of an extensive implementation of blind layers in the component carrier 100. Thus, these functionless blind layers (only contributing to a symmetrical build-up in conventional approaches) may be at least largely omitted, thereby keeping the vertical dimension of the component carrier 100 advantageously small. The symmetrical build-up can be obtained by the combined face-up and face-down configuration of the components 108, 116 in view of the implementation according to FIG. 1 without the need of extensive blind layers.

As shown in FIG. 1, the first component 108 and the second component 116 are arranged laterally side by side within the stack 102 and at the same vertical levels. Accordingly, top surfaces 120, 121 of the first component 108 and the second component 116 are aligned with one another. Furthermore, also bottom surfaces 112, 123 of the first component 108 and the second component 116 are aligned with one another. This advantageously keeps the number of build-up layers of the component carrier 100 small.

As can be taken from FIG. 1 as well, the stack 102 is formed with a highly symmetrical build-up above the first component 108 and the second component 116 compared to below the first component 108 and the second component 116. This high degree of symmetry can be achieved in terms of material and material distribution as well as thicknesses of the various layer structures 104, 106 on both opposing sides of the components 108, 116. As a result, the tendency of the component carrier 100 to experience undesired warpage for delamination, in particular after multiple temperature cycles, is advantageously very low.

Small regions of the stack 102 directly above the first component 108 and directly below the second component 116 are formed exclusively by the electrically insulating layer structures 106 and therefore ensure a proper electrical insulation of the components 108, 116 on their respective main surface being provided without pads 110, 118.

Figure 2:
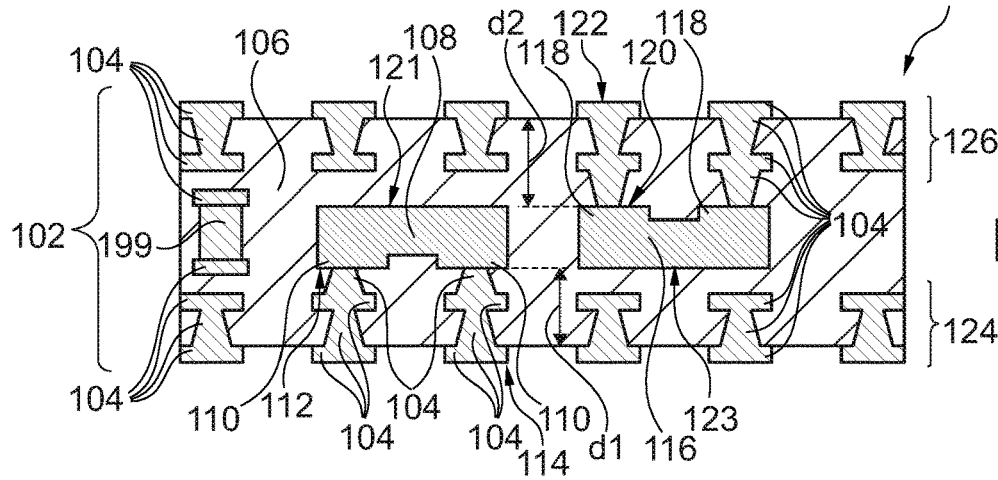
FIG. 2 illustrates a cross-sectional view of a component carrier according to another exemplary embodiment of the invention.

FIG. 2 illustrates a cross-sectional view of a component carrier 100 according to another exemplary embodiment of the invention.

According to FIG. 2, the first redistribution structure 124 and the second redistribution structure 126 each comprise a plurality of electrically conductive layer structures 104 extending over multiple layers structures 104, 106 of the stack 102. More specifically, the first redistribution structure 124 is configured for spatially spreading lateral element sizes and lateral element-to-element distances of elements of the electrically conductive layer structures 104 from smaller lateral dimensions at the first pads 110 to larger lateral dimensions at the bottom surface 114 of the stack 102. Accordingly, the second redistribution structure 126 is configured for spatially spreading lateral element sizes and lateral element-to-element distances of elements of the electrically conductive layer structures 104 from smaller lateral dimensions at the second pads 118 to larger lateral dimensions at the top surface 122 of the stack 102.

The embodiment of FIG. 2 thus differs from the embodiment of FIG. 1 in particular in that the redistribution structures 124, 126 are formed with more layer structures 104, 106 than according to FIG. 1. In particular, the redistribution structures 124, 126 of FIG. 2 comprise multiple stacked copper filled laser vias. Since the number of blind layers—which may be omitted in FIG. 2 compared to a conventional approach with embedded components having their pads all on the same side—is higher in FIG. 2 than in FIG. 1, the achievable thickness reduction of the component carrier 100 is even larger in FIG. 2 than in FIG. 1.

Advantageously, a vertical distance, d1, between the first pads 110 and the bottom surface 114 of the stack 102 is identical to a vertical distance, d2, between the second pads 118 and the top surface 122 of the stack 102. This renders a laser process of forming the laser holes for forming the vertical interconnects (i.e. the copper filled laser vias of the electrically conductive layer structures 104) for contacting the components 108, 116 on the top side and on the bottom side of the component carrier 100 identical. This simplifies and accelerates the laser process.

Figure 4:
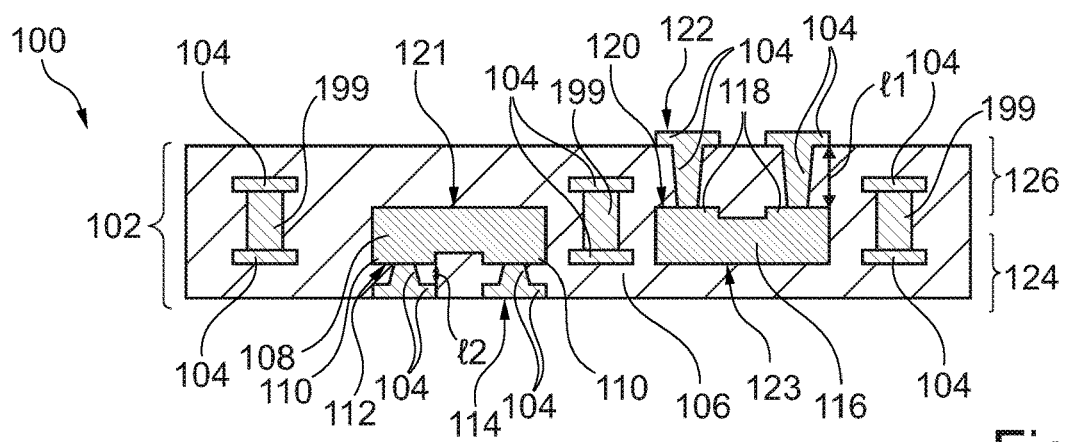

FIG. 3 and FIG. 4 illustrate cross-sectional views of structures obtained during carrying out a method of manufacturing a component carrier 100 with embedded components 108, 116—wherein the component carrier 100 is shown in FIG. 4—according to an exemplary embodiment of the invention.

Referring to FIG. 3, a vertical center of the stack 102 is formed by a base structure 128 (for instance a core which may be made of fully cured material such as FR4). The base structure 128 has a bottom surface 140 aligned with bottom surfaces 112, 123 of the first component 108 and the second component 116. Moreover, the base structure 128 has a top surface 141 which is not aligned with any of top surfaces 120, 121 of the first component 108 and the second component 116 (see distance "b"). More specifically, the components 108, 116 are accommodated in a first cavity 130 and a second cavity 132 of the base structure 128, respectively. The top surfaces 120, 121 of the first component 108 and the second component 116 do not extend up to the top surface 141 of the base structure 128 which thus vertically protrudes beyond the components 108, 116.

As shown in FIG. 3, one or more vertical interconnects 199 (for instance plated through holes) may be formed to extend vertically through the base structure 128 in any of the embodiments described herein. Pads 197 are formed on top main surface 141 of the base structure 128. Correspondingly, further pads 198 are formed on bottom main surface 140 of the base structure 128.

The first cavity 130 and the second cavity 132 are both formed as through holes extending through the entire base structure 128. To close the bottom of the cavities 130, 132 prior to accommodating the components 108, 116 therein, a temporary carrier 134 is attached to a bottom surface 140 of the base structure 128. As a result, the through hole type first cavity 130 and second cavity 132 are converted both into accommodation volumes closed at the bottom side for accommodating the components 108, 116. The temporary carrier 134 may be preferably a sticky tape (with or without holes), a copper foil, a plate (for instance made of FR4), etc.

Next, the first component 108 is placed in the first cavity 130 so that the first pads 110 of the first component 108 are oriented in a downward direction, i.e. in a face-down fashion. Simultaneously or subsequently, the second component 116 is placed in the second cavity 132 so that the second pads 118 of the second component 116 are oriented in an upward direction, i.e. in a face-up fashion. Consequently, the first pads 110 of the first component 108 are attached to the temporary carrier 134. Accordingly, the second pads 118 of the second component 116 are oriented facing away from the temporary carrier 134. The pad-free main surface of the second component 116 is attached to the temporary carrier 134.

Thereafter, one or more at least partially uncured electrically insulating layer structures 106 (such as one or more prepreg sheets) are attached by laminating to the top surface 141 of the base structure 128 which faces away from the temporary carrier 134. Lamination can be carried out by the supply of mechanical pressure, preferably accompanied by heat. During lamination, the uncured material becomes flowable, flows also into gaps between the base structure 128, the temporary carrier 134 and the components 108, 116 (see FIG. 3), cross-links and thereby cures and re-solidifies.

Referring to FIG. 4, the temporary carrier 134 can be removed (for instance peeled off) from the now rigid arrangement composed of base structure 128, components 108, 116 and layer structures 104, 106 after the laminating.

As shown in FIG. 4, further layer structures 104, 106 may be subsequently laminated on one or both of the top side and the bottom side of the arrangement obtained after having removed the temporary carrier 134. Laser holes may be drilled for exposing the pads 110, 118 and may be metallized for electrically contacting the components 108, 116. Then, the readily manufactured component carrier 100 may be obtained.

The embodiment of FIG. 4 implements embedded components 108, 116 which have the same thickness and are aligned with one another at both the top side and the bottom side.

However, as can be taken from FIG. 4 as well, a vertical size of the laser drill hole on the top side (see "l1") is larger than on the bottom side (see "l2"). Consequently, different laser parameters may be advantageous for laser drilling on the front side and the back side.

Figure 5:
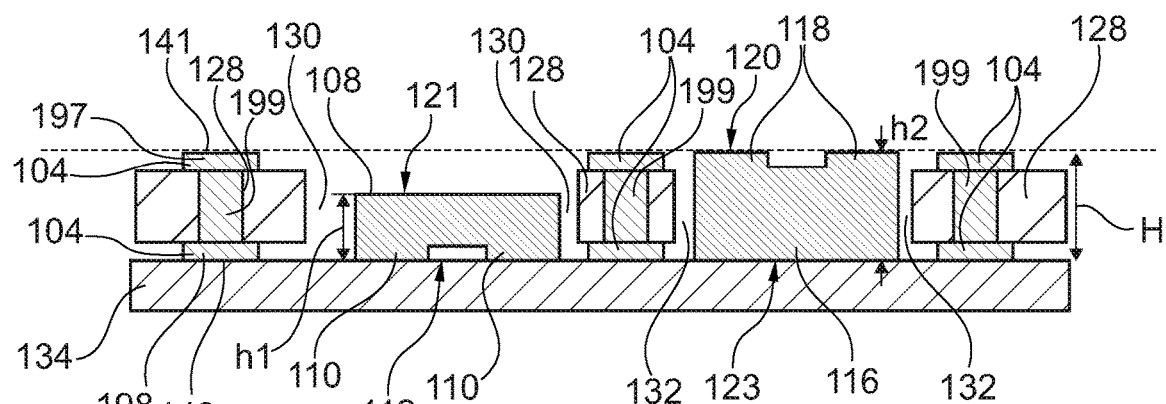
FIG. 5 and FIG. 6 illustrate cross-sectional views of structures obtained during carrying out a method of manufacturing a component carrier with embedded components, shown (for instance as a pre-form) in FIG. 6, according to another exemplary embodiment of the invention.
Figure 6:
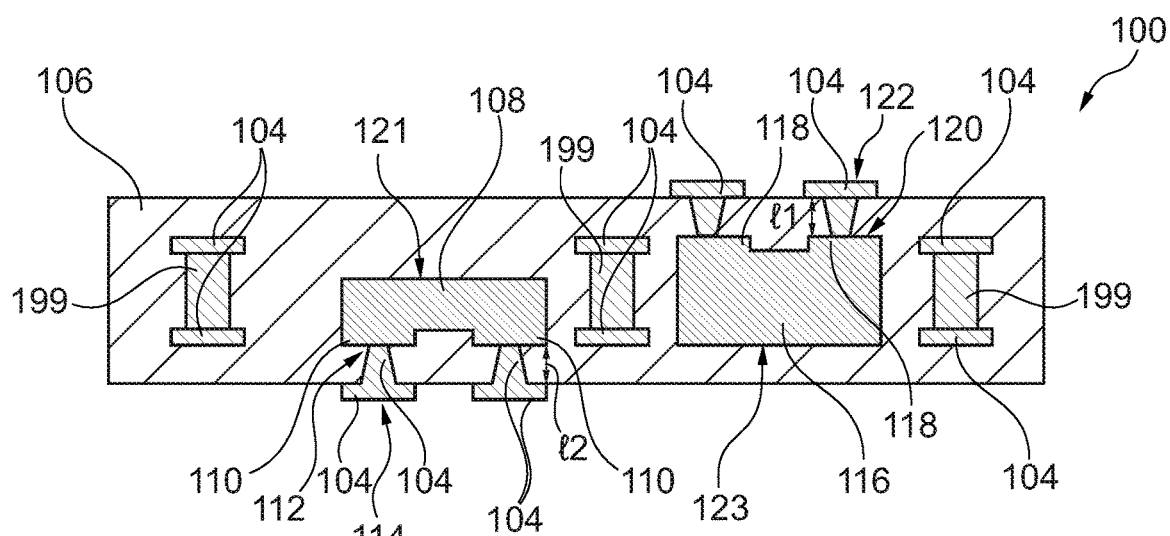

FIG. 5 and FIG. 6 illustrate cross-sectional views of structures obtained during carrying out a method of manufacturing a component carrier 100 with embedded components 108, shown in FIG. 6, according to another exemplary embodiment of the invention.

The embodiment of FIG. 5 and FIG. 6 differs from the embodiment of FIG. 3 and FIG. 4 in that the components 108, 116 have different heights h1≠h2 in FIG. 5 and FIG. 6. However, the vertical size of the laser drill hole on the top side (see "l1") is the same as on the bottom side (see "l2"), i.e. l1=l2. The bottom main surface 140 of the base structure 128 is at the same vertical level as the first pads 110, and the top main surface 141 of the base structure 128 is as the same vertical level as the second pads 118. The vertical extension of the laser vias is the same on the front side and on the back side of the component carrier 100 according to FIG. 6. Consequently, laser drilling on the front side and the back side may be carried out with the same laser parameters and thus in a very efficient and quick way. As a result, the manufactured component carrier 100 has a high reliability and enables a safe and reliable connection between vias and pads.

More specifically and referring to FIG. 5, the first component 108 and the second component 116 have different vertical thicknesses. The second component 116 has the same height, h2, as the height, H, of the base structure 128 (h2=H). Thus, the height h2 of the second component 116 is adjusted to correspond to the height H of the base structure 128. If desired or required, the second component 116 can be grinded up to an appropriate height to fulfil the design rule h2=H. The first component 108 has a smaller height, h1, than the base structure 128 and the second component 116 (h1<H). The base structure 128 has a top surface 141 aligned with a top surface 120 of only the second component 116. The top surface 141 of the base structure 128 however extends vertically beyond the top surface 121 of the first component 108. The bottom surfaces 112, 123, 140 of the components 108, 116 and of the base structure 128 are all attached to the temporary carrier 134 and are thus at the same vertical level.

Advantageously, the pads 197 on top main surface 141 of the base structure 128 are aligned with the second pads 118 on the top surface 120 of the second component 116. Correspondingly, the further pads 198 on bottom main surface 140 of the base structure 128 are aligned with the first pads 110 on the bottom surface 112 of the first component 108. This also promotes a simple laser procedure for contacting the pads 110, 118, 197, 198 during build up formation.

The manufacturing process then continues as described referring to FIG. 3 (i.e. lamination and removal of the temporary carrier 134, further build-up and formation of vertical interconnects). A result of such a manufacturing process is illustrated in FIG. 6.

Referring to FIG. 6, the number and thickness of the layer structures 104, 106 laminated on top and bottom of the structure obtained after peeling off the temporary carrier 134 can be selected to ensure l1=l2. As a result, a matching component height and positioning becomes possible to have the same laser diameters and parameters on front side and back side. This efficiently suppresses warpage, although the thickness of the components 108, 116 is not identical and the build-up is only partially symmetric.

Figure 7:
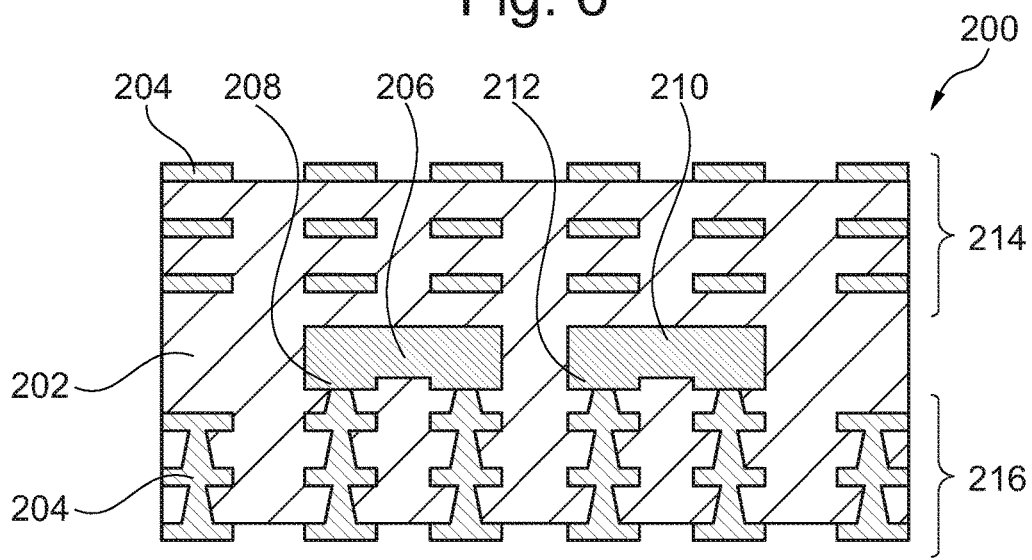
FIG. 7 shows a cross-sectional view of a conventional component carrier.

FIG. 7 shows a cross-sectional view of a conventional component carrier 200. Component carrier 200 comprises dielectric structures 202 and electrically conductive structures 204. Components 206, 210 having pads 208, 212 being all in a face-down configuration are embedded in the component carrier 200. A redistribution structure 216 is shown on a bottom side of the components 206, 210, while blind layers 214 are formed for reasons of a more symmetric build-up to achieve a smaller tendency of warpage on the top side of the components 206, 210. As can be taken from FIG. 7, a considerable amount of volume of the component carrier 200 is lost by the functionally inactive blind layers 214.

Since, according to exemplary embodiments of the invention, such blind layers 214 may be avoided or at least largely reduced, the compactness of component carriers 100 according to exemplary embodiments of the invention may be increased while the suppression of warpage is not compromised.

Figure 8:
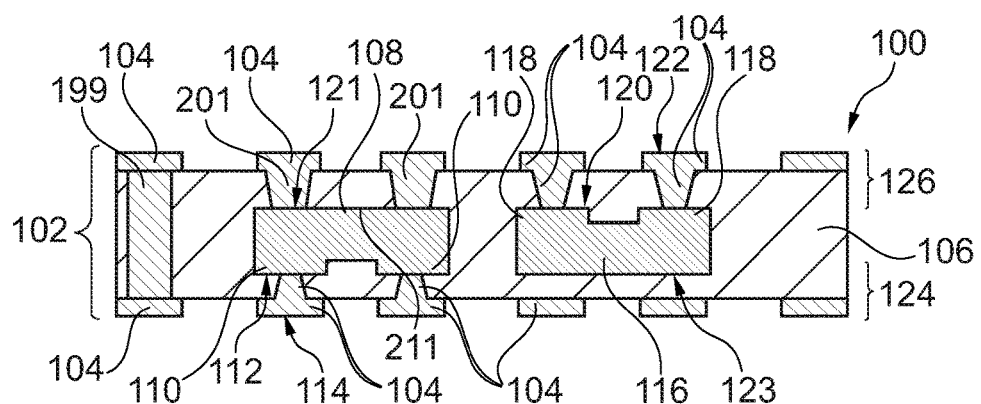
FIG. 8 illustrates a cross-sectional view of a component carrier according to another exemplary embodiment of the invention with thermal vias contacting a padless surface of one of the embedded components.

FIG. 8 illustrates a cross-sectional view of a component carrier 100 according to another exemplary embodiment of the invention with thermal vias contacting a padless surface 211 (i.e. a surface which does not have pads) of the embedded first component 108 for heat removal purposes.

A main difference between the embodiment of FIG. 8 and the embodiment of FIG. 1 is that, according to the embodiment of FIG. 8, the component carrier 100 comprises thermal coupling structures 201 made of a thermally conductive material and extending between padless upper main surface 211 of the first component 108 and the top surface 122 of the stack 102. In the illustrated embodiment, the thermal coupling structures 201 are copper filled laser vias.

More generally, on the backside of the first component 108, a functional element (such as a component or any other structure) may be placed in a recess on the padless or face-less side of the first component 108. Such an additional functional element can directly contact the first component 108 with copper vias (as shown in FIG. 8) to divert heat away from the first component 108 to another layer or to the surface of the component carrier 100.

Figure 9:
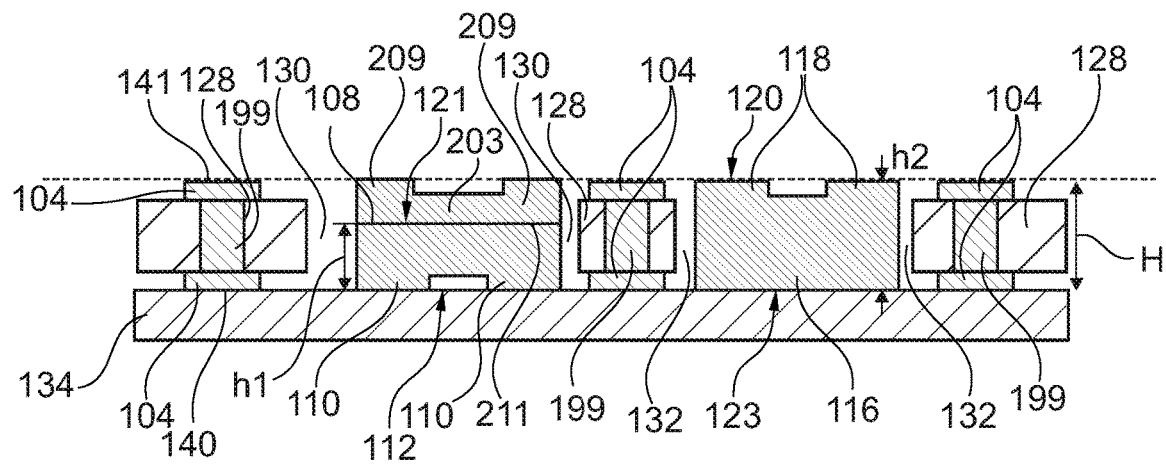
FIG. 9 illustrates a cross-sectional view of a structure obtained during carrying out a method of manufacturing a component carrier with embedded components and with height balancing by stacking components.

FIG. 9 illustrates a cross-sectional view of a structure obtained during carrying out a method of manufacturing a component carrier 100 with embedded components 108, 116 and 203 and with height balancing by stacking the components 108, 203 so that the component stack has the same height H as the second component 116.

A main difference between the embodiment of FIG. 9 and the embodiment of FIG. 5 is that, according to the embodiment of FIG. 9, an additional third component 203 is provided which is also embedded in the stack 102 and which is vertically stacked with the first component 108. The third component 203 has third pads 209 which may be electrically connected with the top surface 122 of the stack 102. As shown, the third component 203 and the first component 108 are connected with one another at mutually facing padless surfaces 211 of the third component 203 and the first component 108. For instance, such a connection may be accomplished by gluing the first component 108 and the third component 203 together at their facing padless surfaces 211.

Advantageously, a summed height H of the stack of the third component 203 and the first component 108 corresponds to a height H of the second component 116 alone. The described component stacking feature may be especially advantageous in case there is a recess due to different individual height values of the first component 108 and the second component 114 which is at least partially balanced out by stacking a further third component 203 with the first component 108.

For instance, the third component 203 may be a semiconductor chip or a cooling element or any other component or structure.

Figure 10:
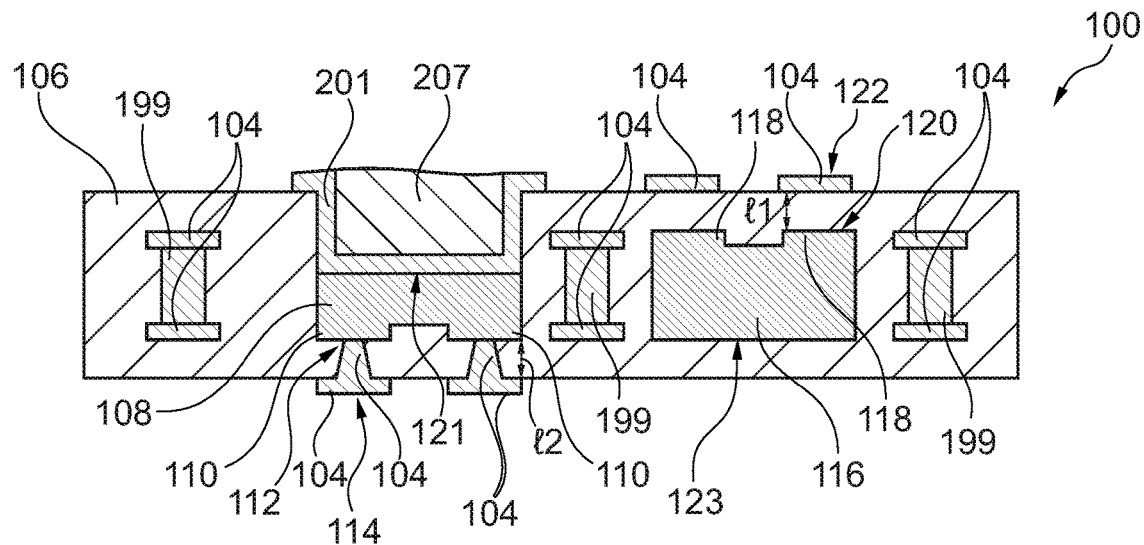
FIG. 10 illustrates a cross-sectional view of a structure obtained during carrying out a method of manufacturing a component carrier with embedded components and with a heatsink plating.

FIG. 10 illustrates a cross-sectional view of a structure obtained during carrying out a method of manufacturing a component carrier 100 with embedded components 108, 116 and with a heatsink plating.

In the embodiment of FIG. 10, the thermal coupling structure 201 comprises a substantially cup-shaped heatsink plating (preferably made of copper) formed in a recess above the first component 108 and along a side wall of the recess up to the top surface 122 of the stack 102. Thus, the creation of a heat sink for the first component 108 can be accomplished by opening the core on the backside or padless surfaces 211 of the first component 108, and by galvanizing the opening. Optionally, a plug 207 (for instance made of electrically insulating material and/or thermally conductive material) may be inserted in the opening above the plating to easily divert heat from the backside of the first component 108.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A component carrier, comprising:
   a stack comprising at least one electrically conductive layer structure and/or at least one electrically insulating layer structure;
   a first component embedded in the stack, having at least one first pad on a bottom surface of the first component, wherein the at least one first pad is electrically connected with a bottom surface of the stack;
   a second component embedded in the stack, having at least one second pad on a top surface of the second component, wherein the at least one second pad is electrically connected with a top surface of the stack;
   a third component embedded in the stack and stacked with one of the first component and the second component;
   wherein the stack comprises a first redistribution structure electrically connecting the at least one first pad of the first component with the bottom surface of the stack; and
   wherein the stack comprises a second redistribution structure electrically connecting the at least one second pad of the second component with the top surface of the stack.

2. The component carrier according to claim 1, comprising at least one of the following features:
   wherein at least one of the first component and the second component is an active component, in particular a semiconductor chip;
   wherein a top surface of the first component is free of pads;
   wherein a bottom surface of the second component is free of pads;
   wherein at least one of the first redistribution structure and the second redistribution structure comprises a plurality of electrically conductive layer structures extending over multiple layer structures of the stack, wherein in particular the first redistribution structure is configured for spatially spreading lateral element sizes and/or lateral element-to-element distances of elements of the electrically conductive layer structures from smaller lateral dimensions at the at least one first pad to larger lateral dimensions at the bottom surface of the stack and/or wherein the second redistribution structure is configured for spatially spreading lateral element sizes and/or lateral element-to-element distances of elements of the electrically conductive layer structures from smaller lateral dimensions at the at least one second pad to larger lateral dimensions at the top surface of the stack;

wherein the first component and the second component are arranged side by side within the stack;

wherein the at least one first pad of the first component and the at least one second pad of the second component are electrically connected with one another via the at least one electrically conductive layer structure;

wherein a vertical distance (d1) between the at least one first pad and the bottom surface of the stack is identical to a vertical distance (d2) between the at least one second pad and the top surface of the stack;

wherein the first component and the second component have different vertical thicknesses;

wherein the first component and the second component have the same vertical thickness;

wherein top surfaces of the first component and the second component are aligned and bottom surfaces of the first component and the second component are aligned;

wherein the stack is formed with a symmetrical build-up above the first component and the second component compared to below the first component and the second component;

wherein regions of the stack directly above the first component and directly below the second component are formed exclusively by one of the at least one electrically insulating layer structure;

wherein at least one of the first component and the second component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip;

wherein the at least one electrically conductive layer structure comprises at least one of the group consisting of copper, aluminum, nickel, silver, gold, palladium, and tungsten, any of the mentioned materials being optionally coated with supra-conductive material such as graphene;

wherein the at least one electrically insulating layer structure comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

wherein the component carrier is shaped as a plate;

wherein the component carrier is configured as one of the group consisting of a printed circuit board, and a substrate;

wherein the component carrier is configured as a laminate-type component carrier.

3. The component carrier according to claim 1, wherein a vertical center of the stack is formed by a base structure, in particular a core, having a bottom main surface aligned with bottom surfaces of the first component and the second component.

4. The component carrier according to claim 3, comprising at least one of the following features:
wherein the base structure has a top main surface aligned with a top surface of only one of the first component and the second component;
wherein the bottom main surface of the base structure is at the same vertical level as the at least one first pad, and/or a top main surface of the base structure is as the same vertical level as the at least one second pad;
wherein at least one pad on a top main surface of the base structure is aligned with the at least one second pad on the top surface of the second component anchor at least one further pad on the bottom main surface of the base structure is aligned with the at least one first pad on the bottom surface of the first component;
at least one vertical interconnect, in particular at least one laser through hole or plated through hole, extending vertically through the base structure.

5. The component carrier according to claim 1, comprising at least one of the following features:
wherein the third component has at least one third pad electrically connected with one of the top surface and the bottom surface of the stack;
wherein the third component and the one of the first component and the second component are connected with one another at facing padless surfaces of the third component and of the one of the first component and the second component;
wherein a height of the stack of the third component and the one of the first component and the second component substantially corresponds to a height of the other one of the first component and the second component.

6. The component carrier according to claim 1, comprising at least one thermal coupling structure made of a thermally conductive material and extending between a padless surface of at least one of the first component and the second component on the one hand and at least one of the top surface and the bottom surface of the stack on the other hand.

7. The component carrier according to claim 6, comprising at least one of the following features:
wherein the at least one thermal coupling structure comprises one or a plurality of vias filled with the thermally conductive material;
wherein the at least one thermal coupling structure comprises a heatsink plating formed in a recess above or below at least one of the first component and the second component and along a side wall of the recess up to at least one of the top surface and the bottom surface of the stack.

8. A method of manufacturing a component carrier, the method comprising:
providing a stack comprising at least one electrically conductive layer structure and/or at least one electrically insulating layer structure;

embedding a first component in the stack, the first component having at least one first pad on a bottom surface of the first component;

electrically connecting the at least one first pad with a bottom surface of the stack;

embedding a second component in the stack, the second component having at least one second pad on a top surface of the second component;

electrically connecting the at least one second pad with a top surface of the stack;

embedding a third component in the stack so that the third component is stacked with one of the first component and the second component;

forming the stack with a first redistribution structure electrically connecting the at least one first pad of the first component with the bottom surface of the stack; and forming the stack with a second redistribution structure electrically connecting the at least one second pad of the second component with the top surface of the stack.

9. The method according to claim 8, further comprising:
providing a base structure with one or more cavities;
placing the first component in one of the one or more cavities so that the at least one first pad of the first component is oriented in a downward direction;
placing the second component in one of the one or more cavities so that the at least one second pad of the second component is oriented in an upward direction.

10. The method according to claim 9, further comprising:
attaching a temporary carrier to a bottom surface of the base structure so that the at least one first pad of the first component is attached to the temporary carrier and the at least one second pad of the second component is facing away from the temporary carrier.

11. The method according to claim 10, further comprising:
laminating at least one of the at least one electrically insulating layer structure to a top surface of the base structure facing away from the temporary carrier;
after the laminating, removing the temporary carrier.

12. The method according to claim 9, wherein a height of at least one of the first component and the second component is adjusted to correspond to a height of the base structure.

13. The method according to claim 8, further comprising:
electrically connecting at least one of the at least one first pad with the bottom surface of the stack and the at least one second pad with the top surface of the stack by laser drilling through at least one of the at least one electrically insulating layer structure and by subsequently at least partially filling at least one laser drilled hole.

14. The method according to claim 8, further comprising:
defining an electronic target functionality to be fulfilled by a component to be embedded in the component carrier;
splitting the target functionality into a first partial functionality and a second partial functionality;
designing the first component to fulfil the first partial functionality;
designing the second component to fulfil the second partial functionality;
providing the first component and the second component in accordance with a result of the designing and embedding the first component with the at least one first pad on the bottom surface and the second component with the at least one second pad on the top surface in the stack.

15. The component carrier according to claim 1, wherein the base structure has a top main surface which is not aligned with any of top surfaces of the first component and the second component.

16. A component carrier, comprising:
a stack comprising at least one electrically conductive layer structure and/or at least one electrically insulating layer structure;
a first component embedded in the stack, having at least one first pad on a bottom surface of the first component, wherein the at least one first pad is electrically connected with a bottom surface of the stack;
a second component embedded in the stack, having at least one second pad on a top surface of the second component, wherein the at least one second pad is electrically connected with a top surface of the stack;
at least one thermal coupling structure made of a thermally conductive material and extending between a padless surface of at least one of the first component and the second component and at least one of the top surface and the bottom surface of the stack;
wherein the stack comprises a first redistribution structure electrically connecting the at least one first pad of the first component with the bottom surface of the stack; and wherein the stack comprises a second redistribution structure electrically connecting the at least one second pad of the second component with the top surface of the stack.

* * * * *

UNITED STATES PATENT AND TRADEMARK OFFICE
CERTIFICATE OF CORRECTION

PATENT NO. : 11,037,881 B2
APPLICATION NO. : 16/590614
DATED : June 15, 2021
INVENTOR(S) : Markus Leitgeb Page 1 of 1

It is certified that error appears in the above-identified patent and that said Letters Patent is hereby corrected as shown below:

In the Claims

Claim 4, Column 20, Line 19, the word -as- should be --at--.

Claim 4, Column 20, Line 23, the word -anchor- should be --and/or--.

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*